United States Patent
Sone

[11] Patent Number: 5,847,598
[45] Date of Patent: Dec. 8, 1998

[54] DIFFERENTIAL AMPLIFIER

[75] Inventor: Kazuya Sone, Tokyo, Japan

[73] Assignee: NEC Corporation, Tokyo, Japan

[21] Appl. No.: 854,447

[22] Filed: May 14, 1997

[30] Foreign Application Priority Data

May 22, 1996 [JP] Japan .................................. 8-126975

[51] Int. Cl.$^6$ .............................. H03K 5/22; G06G 7/12
[52] U.S. Cl. .............................. 327/563; 327/63; 327/65; 330/311; 330/253
[58] Field of Search .................... 327/65, 66, 67, 327/77, 63, 88, 89, 563; 330/311, 253, 255

[56] References Cited

U.S. PATENT DOCUMENTS

| | | | |
|---|---|---|---|
| 4,533,876 | 8/1985 | Haque et al. | 330/253 |
| 4,658,219 | 4/1987 | Saari | 330/311 |
| 4,992,681 | 2/1991 | Urakawa et al. | 327/66 |
| 5,077,489 | 12/1991 | Gola et al. | 330/311 |
| 5,142,219 | 8/1992 | Hsu et al. | 323/314 |
| 5,477,189 | 12/1995 | Koifman et al. | 330/311 |
| 5,589,785 | 12/1996 | Garavan | 327/63 |
| 5,604,464 | 2/1997 | Hwang et al. | 330/311 |

FOREIGN PATENT DOCUMENTS 01-177209 7/1989 Japan .................................. H03F 3/45

OTHER PUBLICATIONS

David B. Ribner et al., "Design Techniques for Cascoded CMOS Op Amps with Improved PSRR and Common–Mode Input Range", *IEEE Journal of Solid–State Circuits*, vol. SC–19, No. 6, Dec. 1984.

"Les amplis op montent en frequence et diminuent en bruit", pp. 30–31, Electronique, No. 34, Jan. 1, 1994.

*Primary Examiner*—Toan Tran
*Attorney, Agent, or Firm*—Young & Thompson

[57] ABSTRACT

This invention is directed to providing a differential amplifier that can increase voltage gain at low frequency and that can be applied in signal processing circuits of high accuracy. Such a differential amplifier is provided in its output section with field effect transistor M5 having its source terminal connected to power terminal 4, its gate terminal connected to bias power terminal 7, and its drain terminal connected to the drain terminal of field effect transistor M3; and field effect transistor M6 having its source terminal connected to power terminal 4, its gate terminal connected to the drain terminals of field effect transistors M3 and M5, and its drain terminal connected to output terminal 3 and the drain terminal of field effect transistor M4.

3 Claims, 4 Drawing Sheets

DIFFERENTIAL AMPLIFIER

BACKGROUND OF THE INVENTION

1. Field of the Invention

The present invention relates to a differential amplifier, and in particular to a differential amplifier that can obtain high gain at low-frequency signal input.

2. Description of the Related Art

FIG. 1 is a circuit diagram showing the configuration of one example of a differential amplifier of the prior art. As shown in FIG. 1, the prior-art example is composed of: field effect transistors M101 and M102 having their source terminals connected in common and their gate terminals connected to input terminals 101 and 102, respectively; constant-current source I101 having one terminal connected to the source terminals of field effect transistors M101 and M102 and the other terminal connected to power terminal 104; field effect transistors M103 and M104 having their gate terminals connected in common to bias power terminal 106 and their source terminals connected to the drain terminals of field effect transistors M101 and M102, respectively; constant-current sources I102 and I103, having one terminal connected to the source terminal of field effect transistor M103 and M104, respectively, and the other terminal connected in common to power terminal 105; field effect transistor M105 having its drain terminal and gate terminal connected to the drain terminal of field effect transistor M103 and its source terminal connected to power terminal 104; and field effect transistor M106 having its gate terminal connected to the gate terminal of field effect transistor M105, its source terminal connected to power terminal 104, and its drain terminal connected to the drain terminal of field effect transistor M104 and output terminal 103. Here, field effect transistors M101 and M102 form a differential transistor pair, and field effect transistors M105 and M106 form a current mirror circuit.

Regarding the operation of the differential amplifier constructed according to the foregoing description, when a signal voltage is applied to input terminals 101 and 102, current outputted from constant-current source I101 is distributed in accordance with the signal voltage applied between input terminals 101 and 102 in the differential transistor pair made up of field effect transistors M101 and M102, and drain current flows in field effect transistors M101 and M102.

The amount of change in drain current at field effect transistor M101 is transferred by way of field effect transistor M103 as the amount of change in drain current in field effect transistor M105.

In the current mirror circuit made up of field effect transistors M105 and M106, the above-described amount of change in drain current at field effect transistor M105 is outputted from output terminal 103 through the action of field effect transistor M106.

On the other hand, the amount of change in drain current at field effect transistor M102 is a value that cancels the amount of change in drain current at field effect transistor M101. In other words, if the drain current at field effect transistor M101 increases, the drain current at field effect transistor M102 decreases to an equal degree. Accordingly, the amount of change in current outputted from output terminal 103 in accordance with the input voltage inputted to input terminals 101 and 103 is twice the amount of change in drain current at field effect transistors M101 and M102.

Here, if the transconductance of field effect transistors M101 and M103 at the balance point is $g_{m1}$ and $g_{m3}$, respectively, and the output resistance of field effect transistors M104 and M106 is $r_{o4}$ and $r_{o6}$, respectively, the voltage gain $A_V$, at low frequency of the differential amplifier shown in FIG. 1 can be represented as:

$$\begin{aligned} A_V &= g_{m1} \cdot (1/g_{m3}) \cdot g_{m3} \cdot \{r_{o4} \cdot r_{o6}/(r_{o4} + r_{o6})\} \\ &= g_{m1} \cdot \{r_{o4} \cdot r_{o6}/(r_{o4} + r_{o6})\} \end{aligned}$$

As an example, if voltage gain is calculated for a case in which $g_{m1}=2\times10^{-3}$(siemens), $r_{o4}=500$(k$\Omega$), and $r_{o6}=200$ (k$\Omega$), $$A_V=2\times10^{-3}\times(1000/7)\times10^3=286\text{(times)}=49 \text{ (dB)}$$

As described hereinabove, the circuit shown in FIG. 1 is a differential amplifier that amplifies and outputs a differential voltage between its inputs and exhibits voltage gain at low frequency on the order of 50 (dB).

When negative feedback is carried out from the output terminal to the input terminals in the abovedescribed differential amplifier of the prior art, gain error occurs in the output signal due to the low voltage gain at low frequency, and as a result, a drawback of the prior-art differential amplifier is that it cannot be applied to signal processing circuits of high accuracy.

SUMMARY OF THE INVENTION

The present invention has the object of providing a differential amplifier that exhibits increased voltage gain at low frequency and that can be applied in signal processing circuits having high accuracy.

To achieve the above-described object, the present invention proposes a differential amplifier that is provided with first and second input terminals and that amplifies and outputs a differential voltage of the input voltages inputted to the first and second input terminals, and moreover, includes:

a differential transistor pair made up of first and second transistors having first electrodes connected in common and second electrodes connected to the first and second input terminals, respectively;

a first constant-current source having one terminal connected to the first electrodes of the first and second transistors and the other terminal connected to a first power terminal;

third and fourth transistors having their second electrodes connected in common to a second power terminal and having their first electrodes connected to the third electrodes of the first and second transistors, respectively;

a fifth transistor having its first electrode connected to the first power terminal, its second electrode connected to a third power terminal, and its third electrode connected to the third electrode of the third transistor;

a sixth transistor having its first electrode connected to the first power terminal, its second electrode connected to the third electrodes of the third and fifth transistors, and its third electrode connected to the output terminal and the third electrode of the fourth transistor; and a second constant-current source having one terminal connected to the first electrode of the third transistor and its other terminal connected to a fourth power terminal, and a third constant-current source having one terminal connected to the first electrode of the fourth transistor and its other terminal also connected to the fourth power terminal.

The above-described first to sixth transistors may be field effect transistors each provided with source electrodes as the first electrodes, gate electrodes as the second electrodes, and drain electrodes as the third electrodes.

Alternatively, the above-described first to sixth transistors may be bipolar transistors each provided with emitter electrodes as the first electrodes, base electrodes as the second electrodes, and collector electrodes as the third electrodes.

In the present invention constructed according to the foregoing description, a fixed supply voltage is applied to the second electrode of the fifth transistor, which is provided as a current-mirror active load in the output section of the differential amplifier, this fifth transistor is used as a high resistance, and moreover, the output is amplified by the sixth transistor, which is provided in the output section of the fifth transistor. As a result, the present invention provides greater voltage gain during the input of a low-frequency signal than the differential amplifier of the prior art.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Embodiments of the present invention will next be described with reference to the accompanying figures.

Figure 2:
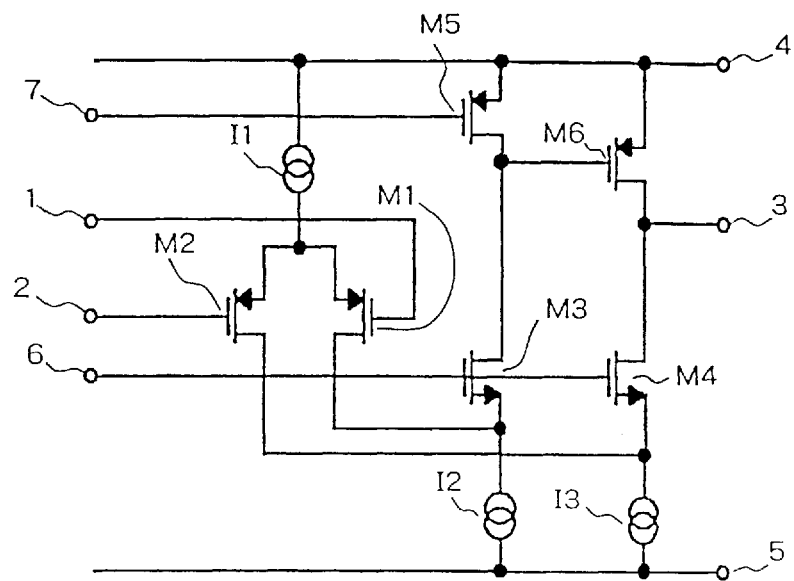
FIG. 2 is a circuit diagram showing one embodiment of the differential amplifier of the present invention.

FIG. 2 is a circuit diagram showing one embodiment of the differential amplifier of the present invention. As shown in FIG. 2, this embodiment is made up of: field effect transistor M1, which is the first transistor, and field effect transistor M2, which is the second transistor, having their source terminals, which are the first electrodes, connected in common, and having their gate terminals, which are the second electrodes, connected to the first input terminal and the second input terminal, respectively; constantcurrent source I1 having one terminal connected to the source terminals of field effect transistors M1 and M2 and having the other terminal connected to the first power terminal 4; field effect transistor M3, which is the third transistor, and field effect transistor M4, which is the fourth transistor, having their gate terminals, which are their second electrodes, connected in common to bias power terminal 6, which is the second power terminal, and having their source terminals, which are their first electrodes, connected to the drain terminals, which are the third electrodes, of field effect transistors M1 and M2, respectively; second constantcurrent source I2 having one terminal connected to the source terminal of field effect transistor M3 and its other terminal connected to the fourth power terminal 5, and third constantcurrent source I3 having one terminal connected to the source terminal of field effect transistor M4 and its other terminal also connected to the fourth power terminal 5; field effect transistor M5, which is the fifth transistor, having its source terminal, which is its first electrode, connected to power terminal 4, its gate terminal, which is its second electrode, connected to bias power terminal 7, which is the third power terminal, and its drain terminal, which is its third electrode, connected to the drain terminal, which is the third electrode, of field effect transistor M3; and field effect transistor M6, which is the sixth transistor, having its source terminal, which is its first electrode, connected to power terminal 4, its gate terminal, which is its second electrode, connected to the drain terminals of field effect transistors M3 and M5, and its drain terminal, which is its third electrode, connected to output terminal 3 and the drain terminal of field effect transistor M4; wherein field effect transistors M1 and M2 form a differential transistor pair.

Regarding the operation of the differential amplifier constructed according to the foregoing description, when signal voltage is applied to input terminals 1 and 2, current outputted from constantcurrent source I1 is distributed in accordance with the signal voltages impressed between input terminals 1 and 2 in the differential transistor pair made up of field effect transistors M1 and M2, and a drain current flows in field effect transistors M1 and M2.

At this time, field effect transistors M3 and M4 both function as common-gate transistors because their gate terminals are connected to bias power terminal 6. In other words, the amounts of change in drain currents flowing in accordance with the signal voltages between input terminals 1 and 2 in field effect transistors M1 and M2 are substantially equal to the amounts of change in drain currents in field effect transistors M3 and M4, respectively.

In addition, a fixed drain current flows in field effect transistor M5 because its gate terminal is connected to bias power terminal 7. As a result, the amount of change in drain current in field effect transistor M3 is transferred to the gate terminal of field effect transistor M6.

The amount of change in drain current in field effect transistor M3 is then amplified by field effect transistor M6 and outputted from output terminal 3.

On the other hand, the amount of change in drain current in field effect transistor M2 is a value that cancels out the amount of change in drain current in field effect transistor M1. In other words, if the drain current in field effect transistor M1 increases, the drain current in field effect transistor M2 decreases to an equal degree.

Accordingly, if the transconductances of field effect transistors M1–M6 are $g_{m1}$–$g_{m6}$, respectively, the output resistance of field effect transistors M5 and M6 are $r_{o5}$ and $r_{o6}$, respectively, and the input resistance of field effect transistor M6 is $r_{i6}$ when output voltage is extracted from output terminal 3, the voltage gain $A_V$ at low frequency of the differential amplifier shown in FIG. 2 can be approximated as:

$$A_V = (1/2) \cdot g_{m1} \cdot (1/g_{m3}) \cdot g_{m3} \cdot \{(r_{o5} \cdot r_{i6})/(r_{o5} + r_{i6})\} \cdot g_{m6} \cdot r_{o6} +$$
$$(1/2) \cdot g_{m2} \cdot (1/g_{m4}) \cdot g_{m4} \cdot r_{o6}$$
$$= \{(1/2) \cdot r_{o6}\} \cdot [\{g_{m1} \cdot r_{o5} \cdot r_{i6}/(r_{o5} + r_{i6})\} \cdot g_{m6} + g_{m2}]$$

As an example, if $A_V$ is calculated for a case in which $g_{m1}=g_{m2}=4\times10^{-3}$(siemens), $g_{m6}=2\times10^{-3}$ (siemens), $r_{o5}=200$ (kΩ), $r_{o6}$=200(kΩ), and $r_{i6}$=100 (kΩ), then:

$$\begin{aligned} A_V &= (1/2) \times 200 \times 10^{-3} \times \\ &\quad (2 \times 10^{-3} \times 4 \times 200 \times 100/300 + 4 \times 10^{-3}) \\ &= 53733 \text{(times)} = 95[dB] \end{aligned}$$

Figure 1:
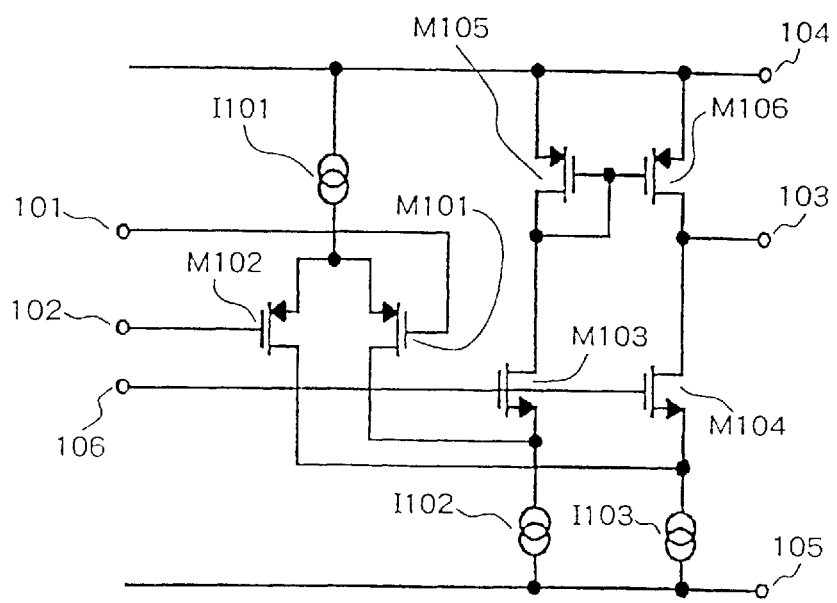
FIG. 1 is a circuit diagram showing the construction of one example of a differential amplifier of the prior art.

As described hereinabove, the value of voltage gain $A_V$, at low frequency for the differential amplifier shown in FIG. 1 is generally on the order of 50 dB, and the differential amplifier shown in FIG. 2 is therefore about 188 times greater than the prior-art differential amplifier of FIG. 1. In other words, the differential amplifier of the present invention provides about 45 dB greater voltage gain.

CONFIGURATIONS OF OTHER EMBODIMENTS

FIGS. 3–7 are circuit diagrams showing the configurations of other embodiments of the differential amplifier of the present invention.

Figure 3:
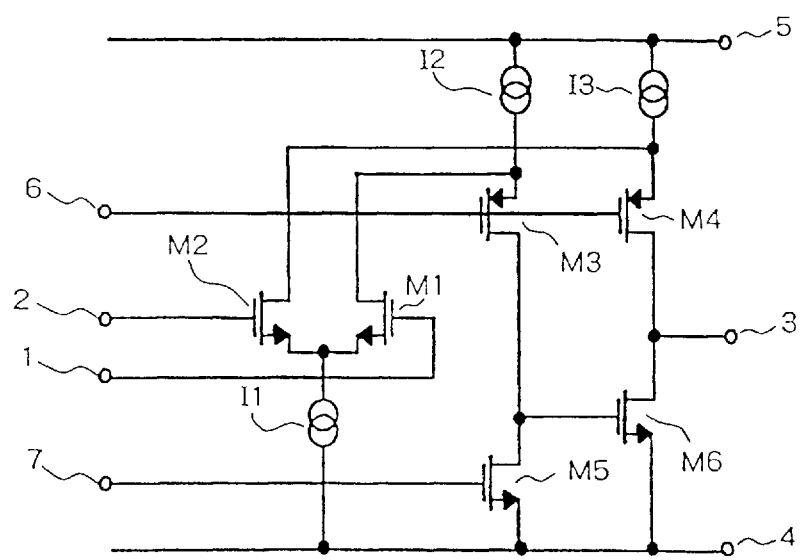
FIG. 3 is a circuit diagram showing another embodiment of the differential amplifier of the present invention.

In the differential amplifier shown in FIG. 3, the polarities of field effect transistors M1–M6 and constant-current sources I1–I3 are the opposite of those of the differential amplifier shown in FIG. 2. Because the operation speed of a transistor unit of a differential transistor pair having the polarity shown in FIG. 3 can generally be raised over that of the differential amplifier shown in FIG. 2, the operation speed of the overall differential amplifier can be increased.

Figure 4:
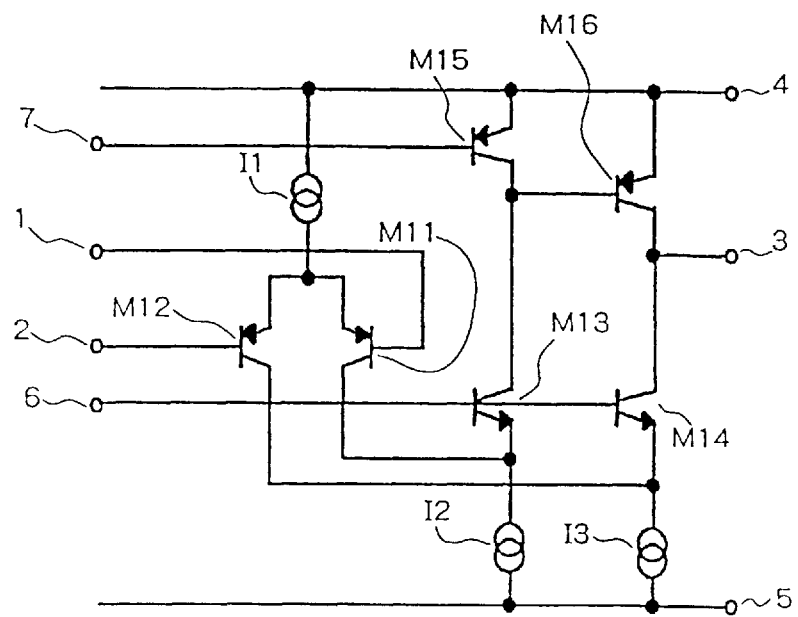
FIG. 4 is a circuit diagram showing another embodiment of the differential amplifier of the present invention.

In contrast with the differential amplifier shown in FIG. 2, the differential amplifier shown in FIG. 4 employs bipolar transistors M11–M16 in place of field effect transistors M1–M6, and accordingly, the source terminals are replaced by emitter terminals, the gate terminals by base terminals, and the drain terminals by collector terminals. In the differential amplifier shown in FIG. 4, the circuit of the present invention employs bipolar processing and can be applied in integrated circuits.

Figure 5:
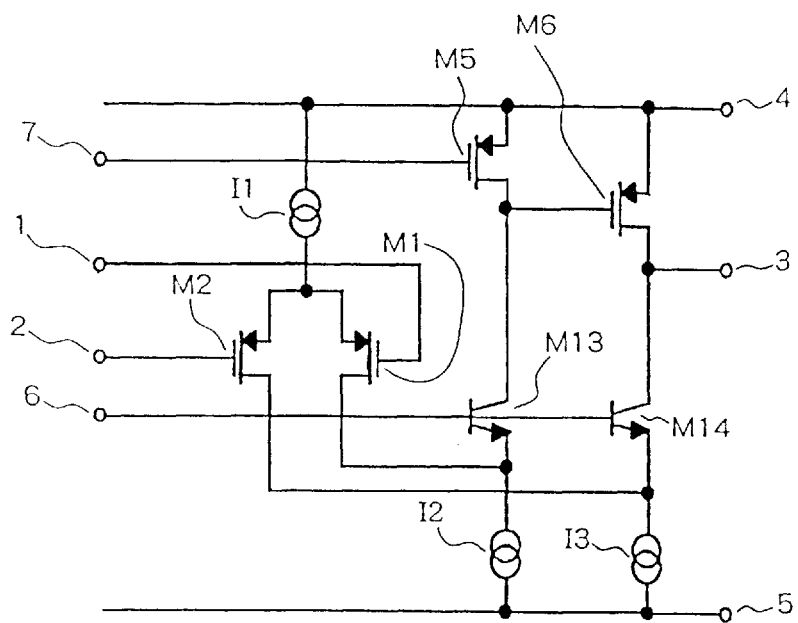
FIG. 5 is a circuit diagram showing another embodiment of the differential amplifier of the present invention.

In contrast with the differential amplifier shown in FIG. 2, the differential amplifier shown in FIG. 5 employs bipolar transistors M13 and M14 in place of field effect transistors M3 and M4. In this case, the transconductance of bipolar transistors can be made greater than for field effect transistors with the same operating current. As a result, the differential amplifier shown in FIG. 5 can obtain even greater voltage gain at low frequency than the differential amplifier shown in FIG. 2.

Figure 6:
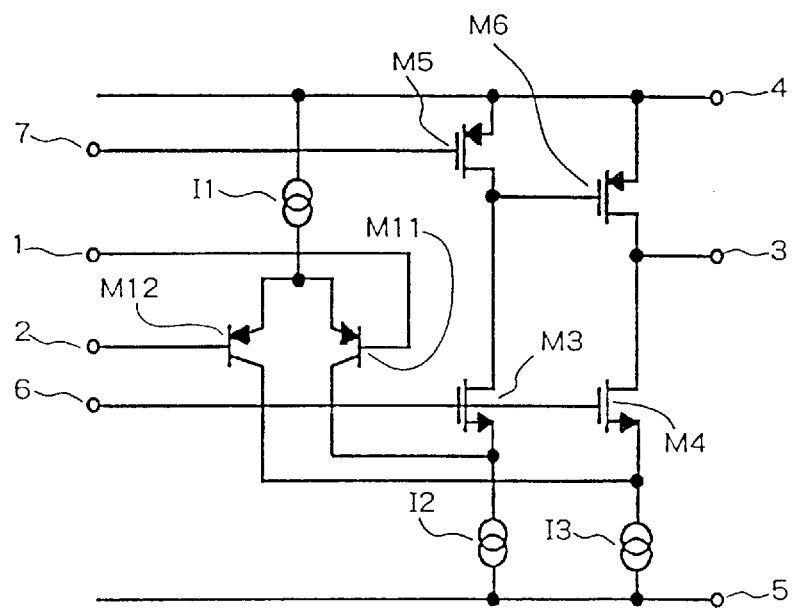
FIG. 6 is a circuit diagram showing another embodiment of the differential amplifier of the present invention.

In contrast with the differential amplifier shown in FIG. 2, the differential amplifier shown in FIG. 6 employs bipolar transistors M11 and M12 in place of field effect transistors M1 and M2. In this case, the offset voltage of a transistor pair can be made smaller with a bipolar transistor than with a field effect transistor. Consequently, the differential amplifier shown in FIG. 6 enables a greater reduction of input offset voltage than the differential amplifier shown in FIG. 2.

Figure 7:
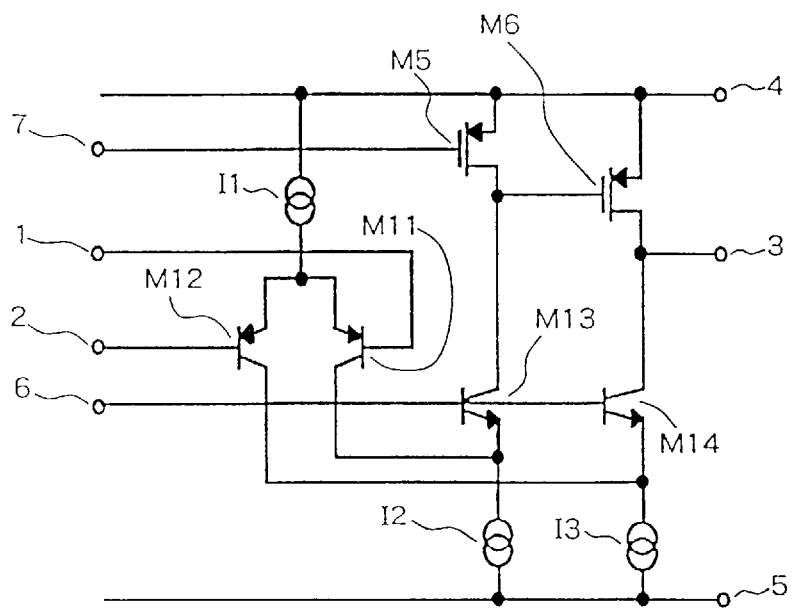
FIG. 7 is a circuit diagram showing another embodiment of the differential amplifier of the present invention.

In contrast with the differential amplifier shown in FIG. 2, the differential amplifier shown in FIG. 7 employs bipolar transistors M11–M14 in place of field effect transistors M1–M4, thereby enabling a further increase in low-frequency voltage gain as well as a further reduction in the input offset voltage.

As described hereinabove, the present invention enables an increase in the voltage gain at times of low-frequency signal input, and as a result, gain error in the output signal can be reduced when carrying out negative feedback, and the resulting differential amplifier can be applied to signal processing circuits having a high level of accuracy.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A differential amplifier that is provided with first and second input terminals and that amplifies and outputs a differential voltage of input voltages inputted to said first and second input terminals, further comprising:

a differential transistor pair made up of first and second transistors having first electrodes connected in common and second electrodes connected to said first and second input terminals, respectively;

a first constant-current source having one terminal connected to said first electrodes of said first and second transistors and its other terminal connected to a first power terminal;

third and fourth transistors having their second electrodes connected in common to a second power terminal and having their first electrodes connected to third electrodes of said first and second transistors, respectively;

a fifth transistor having its first electrode connected to said first power terminal, its second electrode connected to a third power terminal, and its third electrode connected to a third electrode of said third transistor;

a sixth transistor having its first electrode connected to said first power terminal, its second electrode connected to the third electrodes of said third and fifth transistors, and its third electrode connected to an output terminal and a third electrode of said fourth transistor; and a second constant-current source having one terminal connected to the first electrode of said third transistor and its other terminal connected to a fourth power terminal, and a third constant-current source having one terminal connected to the first electrode of said fourth transistor and its other terminal also connected to said fourth power terminal.

2. A differential amplifier according to claim 1 wherein said first to sixth transistors are field effect transistors each provided with source electrodes as said first electrodes, gate electrodes as said second electrodes, and drain electrodes as said third electrodes.

3. A differential amplifier according to claim 1 wherein said first to sixth transistors are bipolar transistors each provided with emitter electrodes as said first electrodes, base electrodes as said second electrodes, and collector electrodes as said third electrodes.

* * * * *